(12) United States Patent
Bae et al.

(10) Patent No.: US 12,218,054 B2
(45) Date of Patent: Feb. 4, 2025

(54) METHOD OF FORMING AN INTEGRATED CIRCUIT DEVICE HAVING AN ETCH-STOP LAYER BETWEEN METAL WIRES

(71) Applicant: Samsung Electronics Co., Ltd., Suwon-si (KR)

(72) Inventors: Taeyong Bae, Albany, NY (US); Hoonseok Seo, Niskayuna, NY (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/849,836

(22) Filed: Jun. 27, 2022

(65) Prior Publication Data
US 2022/0336353 A1  Oct. 20, 2022

Related U.S. Application Data

(62) Division of application No. 17/066,526, filed on Oct. 9, 2020, now Pat. No. 11,450,608.
(Continued)

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76816* (2013.01); *H01L 21/76829* (2013.01);
(Continued)

(58) Field of Classification Search
CPC ............ H01L 23/5283; H01L 23/5286; H01L 23/5226; H01L 23/53295; H01L 21/76816; H01L 21/76802; H01L 21/76804; H01L 21/76877; H01L 21/76807; H01L 21/76897; H01L 21/76829; H01L 21/76831; H01L 21/76832; H01L 21/76834; H01L 21/76846; H01L 21/7685; H01L 21/76852; H01L 23/53228; H01L 23/53233; H01L 23/53238;
(Continued)

(56) References Cited

U.S. PATENT DOCUMENTS 6,331,481 B1  12/2001  Stamper et al.
9,502,350 B1 * 11/2016  Bonilla ............. H01L 23/53228
(Continued)

FOREIGN PATENT DOCUMENTS

CN  105321925 A  2/2016

*Primary Examiner* — Younes Boulghassoul
(74) *Attorney, Agent, or Firm* — Myers Bigel, P.A.

(57) ABSTRACT

Integrated circuit devices and methods of forming the same are provided. The integrated circuit devices may include a first insulating layer and a plurality of metal wires on the first insulating layer. The plurality of metal wires may include a first metal wire including a first upper surface and a first lower surface that faces the first insulating layer and a second metal wire including a second upper surface and a second lower surface that faces the first insulating layer and is coplanar with the first lower surface. The first metal wire may have a first width monotonically decreasing from the first lower surface to the first upper surface, and the second metal wire may have a second width monotonically increasing from the second lower surface to the second upper surface.

22 Claims, 14 Drawing Sheets

Related U.S. Application Data

(60) Provisional application No. 63/062,690, filed on Aug. 7, 2020.

(51) Int. Cl.
*H01L 23/522* (2006.01)
*H01L 23/532* (2006.01)

(52) U.S. Cl.
CPC .. *H01L 21/76846* (2013.01); *H01L 21/76877* (2013.01); *H01L 21/76885* (2013.01); *H01L 21/76897* (2013.01); *H01L 23/5221* (2013.01); *H01L 23/5226* (2013.01); *H01L 23/53209* (2013.01); *H01L 23/53228* (2013.01); *H01L 23/53238* (2013.01); *H01L 23/53252* (2013.01); *H01L 23/53266* (2013.01); *H01L 23/53295* (2013.01); *H01L 21/76834* (2013.01)

(58) Field of Classification Search
CPC ......... H01L 23/53257; H01L 23/53261; H01L 23/53266; H01L 21/76895; H01L 21/76885; H01L 21/823475; H01L 21/823871

See application file for complete search history.

(56) References Cited

U.S. PATENT DOCUMENTS

| | | |
|---|---|---|
| 9,583,434 B2 | 2/2017 | Kao |
| 9,761,489 B2 | 9/2017 | Mebarki et al. |
| 9,852,980 B2 | 12/2017 | Bonilla et al. |
| 10,290,580 B2 | 5/2019 | Liu et al. |
| 10,388,600 B2 | 8/2019 | Reznicek et al. |
| 10,559,530 B2 | 2/2020 | Amanapu et al. |
| 10,777,456 B1* | 9/2020 | Aizawa ............... H01L 21/3212 |
| 11,239,165 B2 | 2/2022 | Xie et al. |
| 2002/0084530 A1* | 7/2002 | Park .................... H01L 23/5222 257/E23.152 |
| 2014/0252625 A1 | 9/2014 | Ting et al. |
| 2016/0111368 A1* | 4/2016 | Zhang ............... H01L 21/76804 257/773 |
| 2016/0343660 A1* | 11/2016 | Kim .................. H01L 23/5226 |
| 2017/0040257 A1 | 2/2017 | Bruce et al. |
| 2018/0308752 A1 | 10/2018 | Zhang et al. |
| 2019/0198444 A1 | 6/2019 | Amanapu et al. |
| 2019/0295942 A1 | 9/2019 | Badaroglu et al. |
| 2020/0013715 A1* | 1/2020 | Park .................. H01L 21/76877 |
| 2020/0135558 A1 | 4/2020 | Standaert et al. |
| 2021/0098292 A1* | 4/2021 | Nguyen ............ H01L 21/02126 |
| 2021/0167006 A1* | 6/2021 | Bao .................. H01L 21/76816 |
| 2021/0217698 A1 | 7/2021 | Cheng et al. |

* cited by examiner

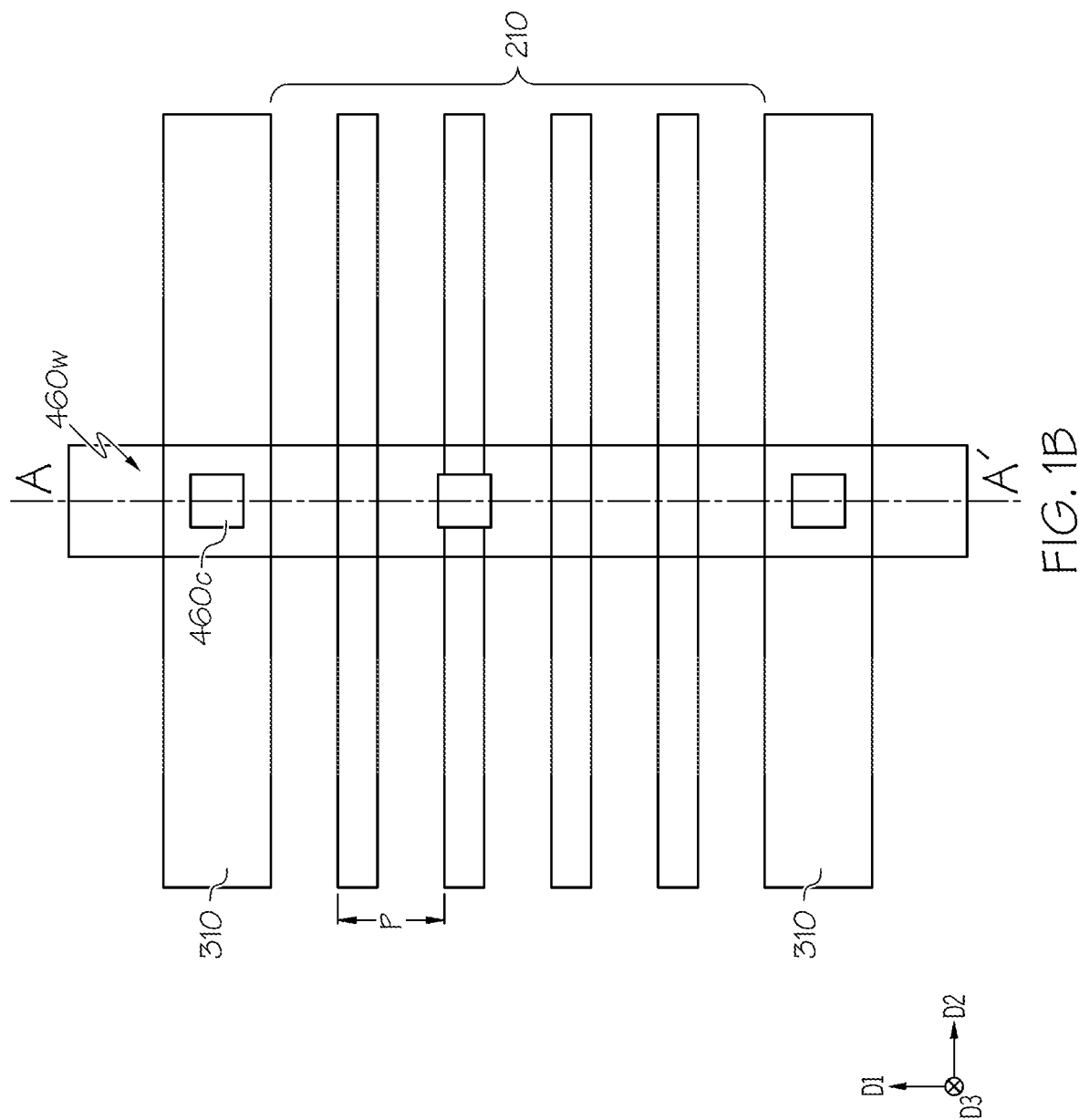

METHOD OF FORMING AN INTEGRATED CIRCUIT DEVICE HAVING AN ETCH-STOP LAYER BETWEEN METAL WIRES

CROSS-REFERENCE TO RELATED APPLICATION

This application is a divisional of U.S. application Ser. No. 17/066,526, filed Oct. 9, 2020, which claims priority to U.S. Provisional Application Ser. No. 63/062,690, entitled HYBRID METALLIZATION WITH SUBTRACTIVE AND DAMASCENE PROCESSES, filed in the USPTO on Aug. 7, 2020, the disclosure of which is hereby incorporated by reference herein in its entirety.

FIELD

The present disclosure generally relates to the field of electronics and, more particularly, to integrated circuit devices.

BACKGROUND

As dimensions of metal wires of an integrated circuit device decrease, it may be difficult to form metal wires that have low electrical resistances and are structurally stable.

SUMMARY

According to some embodiments of the present inventive concept, integrated circuit devices may include a first insulating layer and a plurality of metal wires on the first insulating layer. The plurality of metal wires may include a first metal wire including a first upper surface and a first lower surface that faces the first insulating layer and a second metal wire including a second upper surface and a second lower surface that faces the first insulating layer and is coplanar with the first lower surface. The first metal wire may have a first width monotonically decreasing from the first lower surface to the first upper surface, and the second metal wire may have a second width monotonically increasing from the second lower surface to the second upper surface.

According to some embodiments of the present inventive concept, integrated circuit devices may include a first insulating layer and a second insulating layer that are sequentially stacked, a lower etch stop layer extending between the first insulating layer and the second insulating layer, and a plurality of metal wires on the first insulating layer and in the second insulating layer. The plurality of metal wires may include a first metal wire and a second metal wire. The lower etch stop layer may extend on a sidewall of the first metal wire from a lower surface to an upper surface of the first metal wire, and the second metal wire may extend through the lower etch stop layer.

According to some embodiments of the present inventive concept, integrated circuit devices may include an insulating layer and a plurality of metal wires on the insulating layer. Each of the plurality of metal wires may include a lower surface contacting an upper surface of the insulating layer. The plurality of metal wires may include a first metal wire and a second metal wire. The second metal wire may include a first metal element, and the first metal wire may be devoid of the first metal element.

According to some embodiments of the present inventive concept, methods of forming an integrated circuit devices may include forming a first metal wire on a first insulating layer, forming a second insulating layer on the first metal wire and the first insulating layer, forming an opening extending through the second insulating layer, and forming a second metal wire in the opening. The first metal wire has a first lower surface that faces the first insulating layer, and the second metal wire has a second lower surface that faces the first insulating layer and is coplanar with the first lower surface.

BRIEF DESCRIPTION OF THE DRAWINGS

FIG. 1B is a schematic layout of the integrated circuit device of FIG. 1A according to some embodiments of the inventive concept.

DETAILED DESCRIPTION

When metal wires at the same level include both a narrow wire and a wide wire, it may be difficult to form the narrow and wide wires to have low electrical resistances and be structurally stable using the same process. If a damascene process is used to form narrow and wide wires, the narrow wire may move during the process, and defects thus may occur. If an etch process is used to form narrow and wide wires, a number of metal layers included in the narrow and wide wires may be limited, and the wide wire may have high electrical resistance.

According to some embodiments of the present inventive concept, two separate processes may be used to form a narrow wire and a wide wire that are at the same level. In some embodiments, a narrow wire may be formed by an etch process, and a wide wire may be formed by a damascene process.

Figure 1A:
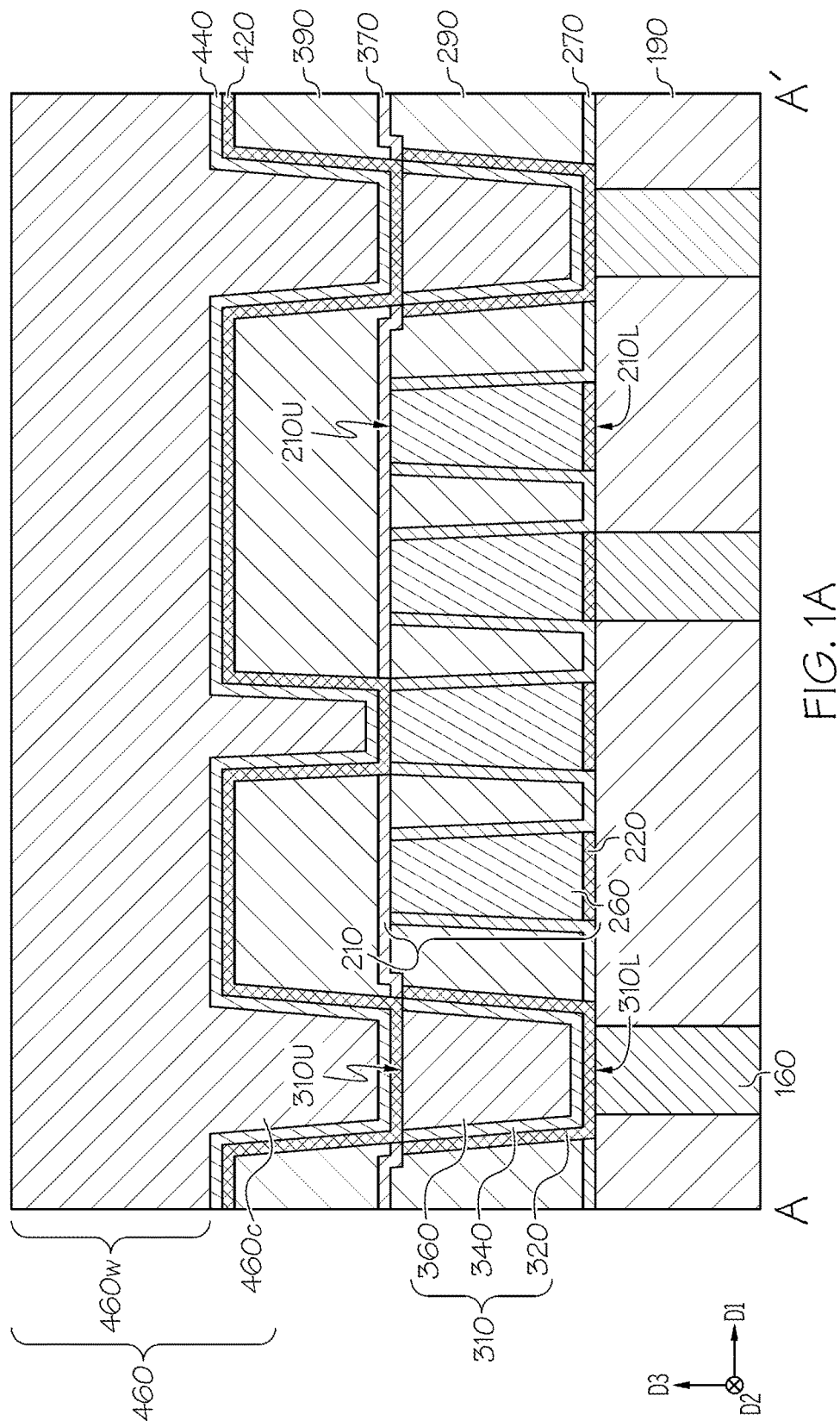
FIG. 1A is a cross-sectional view of an integrated circuit device taken along the line A-A' of FIG. 1B according to some embodiments of the inventive concept.

FIG. 1A is a cross-sectional view of an integrated circuit device taken along the line A-A' of FIG. 1B according to some embodiments of the inventive concept. FIG. 1B is a schematic layout of the integrated circuit device of FIG. 1A according to some embodiments of the inventive concept.

Referring to FIGS. 1A and 1B, the integrated circuit device may include an upper wire 460 and lower wires that include first metal wires 210 and second metal wires 310. The first metal wires 210 and the second metal wires 310 may be spaced apart from each other in a first direction D1. Multiple first metal wires 210 (e.g., four first metal wires 210) may be provided between two second metal wires 310. Each of the first metal wires 210 and second metal wires 310 may extend in a second direction D2. The second direction D2 may be perpendicular to the first direction D1. As used herein, "an element A extends in a direction X" (or similar language) may mean that the element A extends longitudinally in the direction X. The first direction D1 and the second direction D2 may be a first horizontal direction and a second horizontal direction, respectively.

A widest width of the first metal wire 210 in the first direction D1 may be narrower than a widest width of the second metal wire 310 in the first direction D1. For example, a pitch P of the first metal wire 210 may be about 24 nm.

The lower wires 210 and 310 and the upper wire 460 may be stacked in a third direction D3. The third direction D3 may be perpendicular to both the first direction D1 and the second direction D2. The third direction D3 may be a vertical direction. The upper wire 460 may extend in the first direction D1. Although FIG. 1A shows a single upper wire 460, multiple upper wires 460 may be provided.

Each of the first metal wires 210 may be electrically connected to an element of a transistor (e.g., a source/drain region, or a gate). Each of the second metal wires 310 may be electrically connected to a power source (e.g., Vdd or Vss) of the integrated circuit device. The upper wire 460 may be electrically connected to at least one of the first metal wires 210 and the second metal wires 310.

Referring to FIG. 1A, the integrated circuit device may include a first insulating layer 190, a second insulating layer 290, and a third insulating layer 390 sequentially stacked. Each of the first insulating layer 190, the second insulating layer 290, and the third insulating layer 390 may include an insulating material (e.g., silicon oxide, or low dielectric material). Lower contacts 160 may be provided in the first insulating layer 190. Each of the lower contacts 160 may include a conductive material and may electrically connect one of the first metal wires 210 or one of the second metal wires 310 to an element of the integrated circuit device.

The first metal wires 210 and the second metal wires 310 may be provided on the first insulating layer 190 and in the second insulating layer 290. Each of the lower wires includes a lower surface contacting the first insulating layer 190.

In some embodiments, lower surfaces 210L of the first metal wires 210 may be coplanar with lower surfaces 310L of the second metal wires 310 as illustrated in FIG. 1A. The first metal wire 210 may have a first width in the first direction D1 monotonically decreasing from the lower surface 210L to an upper surface 210U thereof. The second metal wires 310 may have a second width in the first direction D1 monotonically increasing from the lower surface 310L to an upper surface 310U thereof. The first width of the lower surface 210L of the first metal wire 210 may be narrower than the second width of the upper surface 310U of the second metal wire 310.

Although FIG. 1A shows both the first metal wires 210 and the second metal wires 310 have slanted sidewalls, in some embodiments, at least some of the first metal wires 210 and the second metal wires 310 may have vertical sidewalls and may have a uniform width in the first direction D1 along the third direction D3.

In some embodiments, the upper surface 210U of the first metal wire 210 may be farther from the first insulating layer 190 than the upper surface 310U of the second metal wire 310 as illustrated in FIG. 1A. In some embodiments, the upper surface 210U of the first metal wire 210 may be coplanar with the upper surface 310U of the second metal wire 310.

The first metal wire 210 may include a first adhesion layer 220 and a first metal layer 260 that are sequentially stacked. The first adhesion layer 220 may include, for example, titanium nitride (TiN), tantalum nitride (TaN), titanium oxide (TiO), titanium (Ti) and/or tantalum (Ta). The first metal layer 260 may include, for example, ruthenium (Ru), molybdenum (Mo), cobalt (Co), and/or tungsten (W). As used herein the term "and/or" includes any and all combinations of one or more of the associated listed items.

The second metal wire 310 may include a second adhesion layer 320, a first thin metal layer 340, and a second metal layer 360. The second adhesion layer 320 may include, for example, TiN, TaN, TiO, Ti, and/or Ta. The first thin metal layer 340 may include, for example, Ru, Mo, Co, and/or W. The second metal layer 360 may include, for example, copper (Cu). In some embodiments, both the first metal layer 260 and the first thin metal layer 340 may include the same metal element (e.g., Ru). In some embodiments, the first metal layer 260 may not include a metal element that is included in the second metal layer 360.

A first etch stop layer 270 may extend between the first insulating layer 190 and the second insulating layer 290. The first etch stop layer 270 may contact both the first insulating layer 190 and the second insulating layer 290. The first etch stop layer 270 may have a uniform thickness as illustrated in FIG. 1A. The first etch stop layer 270 may extend on a sidewall of the first metal wires 210. In some embodiments, the first etch stop layer 270 may contact an entirety of the sidewall of the first metal wires 210 as illustrated in FIG. 1A. The second metal wires 310 may extend through the first etch stop layer 270 and may contact the first insulating layer 190 as illustrated in FIG. 1A.

A second etch stop layer 370 may extend on the first metal wires 210 and the second metal wires 310. The second etch stop layer 370 may extend between the second insulating layer 290 and the third insulating layer 390. A lower surface of the second etch stop layer 370 may contact the upper surface 210U of the first metal wire 210. The upper surface 310U of the second metal wire 310 may not be higher than the lower surface of the second etch stop layer 370. In some embodiments, the upper surface 310U of the second metal wire 310 may contact the lower surface of the second etch stop layer 370 as illustrated in FIG. 1A.

Each of the first etch stop layer 270 and the second etch stop layer 370 may include, for example, silicon carbon nitride (SiCN), aluminum oxide (AlO), and/or aluminum nitride (AlN). In some embodiments, the first etch stop layer 270 and/or the second etch stop layer 370 may be a SiCN layer.

The upper wire 460 may include contact portions 460c and a liner portion 460w. Each of the contact portions 460 may contact one of the first metal wires 210 or one of the second metal wires 310. The upper wire 460 may include, for example, Cu. Although FIG. 1A shows that the upper wire 460 includes three contact portions 460c, the upper wire 460 may include a single contact portion 460c, two contact portions 460c, or more than three contact portions 460c.

A third adhesion layer 420 and a second thin metal layer 440 may be provided between the upper wire 460 and the third insulating layer 390. The third adhesion layer 420 may include, for example, TiN, TaN, TiO, Ti, and/or Ta. The second thin metal layer 440 may include, for example, Ru, Mo, Co, and/or W.

Figure 2A:
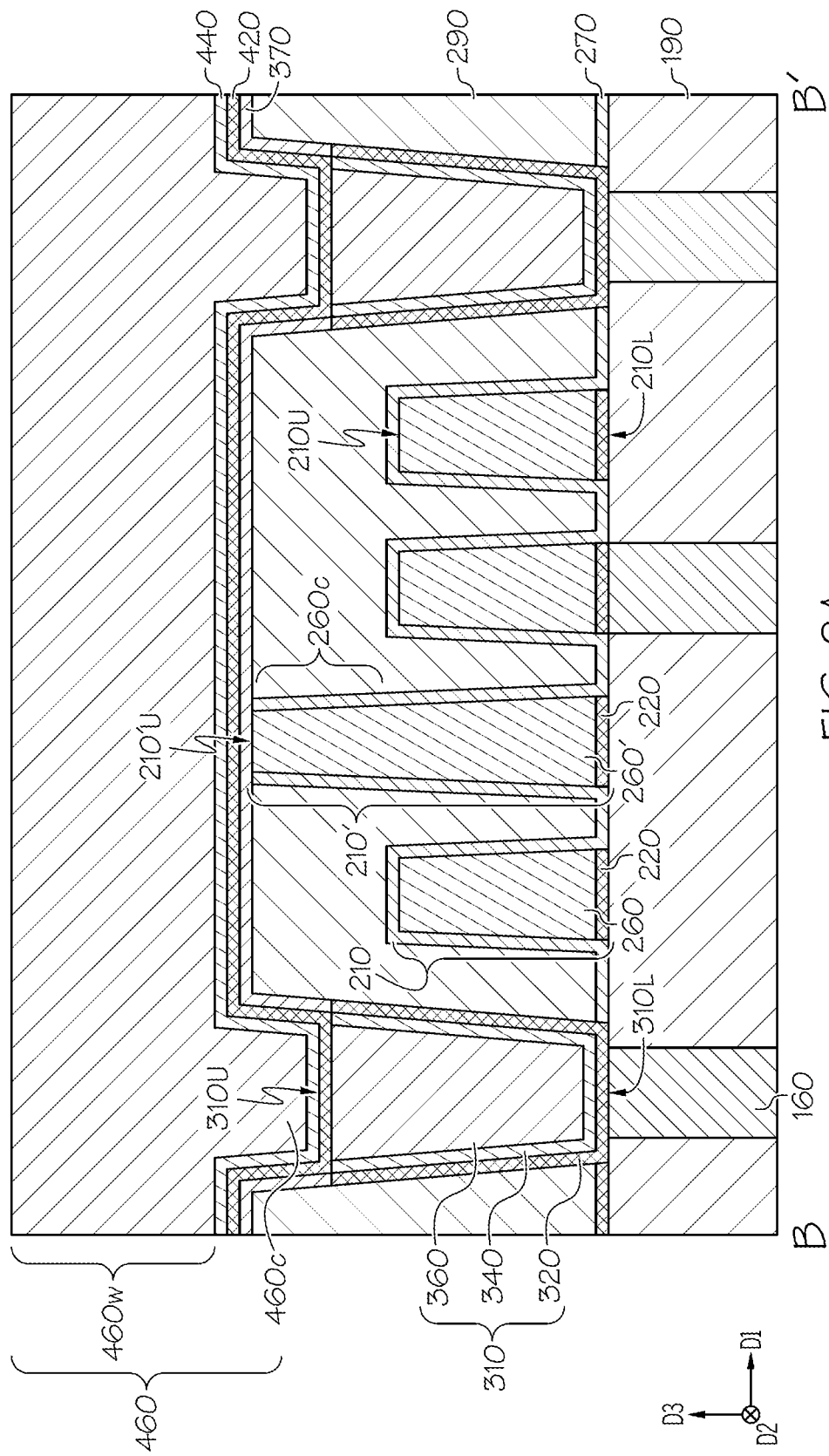
FIG. 2A is a cross-sectional view of an integrated circuit device taken along the line B-B' of FIG. 2B according to some embodiments of the inventive concept.
Figure 2B:
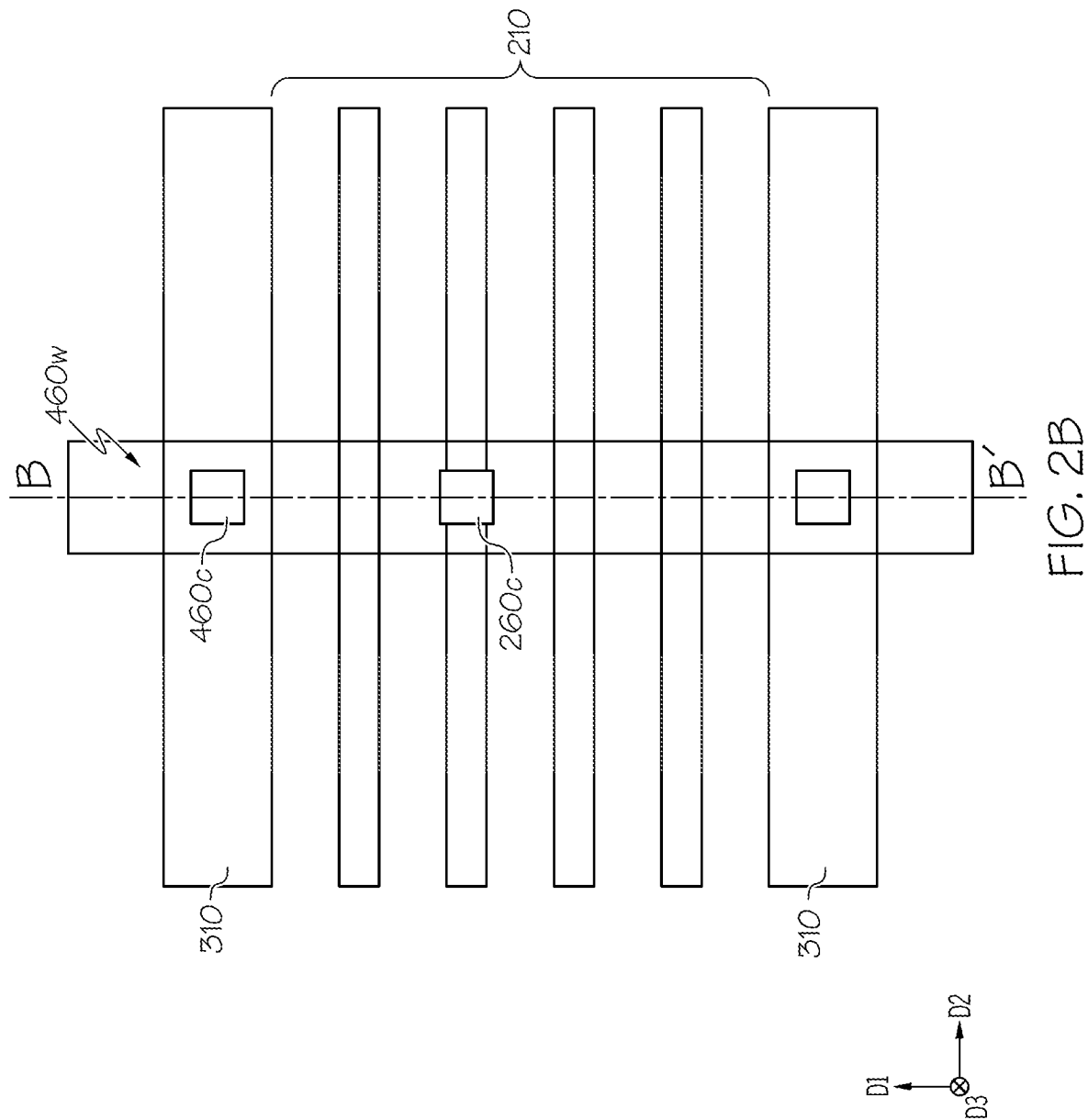
FIG. 2B is a schematic layout of the integrated circuit device of FIG. 2A according to some embodiments of the inventive concept.

FIG. 2A is a cross-sectional view of an integrated circuit device taken along the line B-B' of FIG. 2B according to some embodiments of the inventive concept. FIG. 2B is a schematic layout of the integrated circuit device of FIG. 2A according to some embodiments of the inventive concept.

The first metal wires 210 may include a tall first metal wire 210' that may have an upper surface 210'U farther from the first insulating layer 190 than the upper surfaces 210U of remaining first metal layers 210 and may include a contact portion 260c provided above the upper the upper surfaces 210U of remaining first metal layers 210. The upper surface 210'U of the tall first metal wire 210' may contact the lower surface of the upper etch stop layer 370.

In some embodiments, the upper surface 310U of the second metal wires may be closer to the first insulating layer 190 than the upper surface 210'U of the tall first metal wire 210', as illustrated in FIG. 2A.

Figure 3:
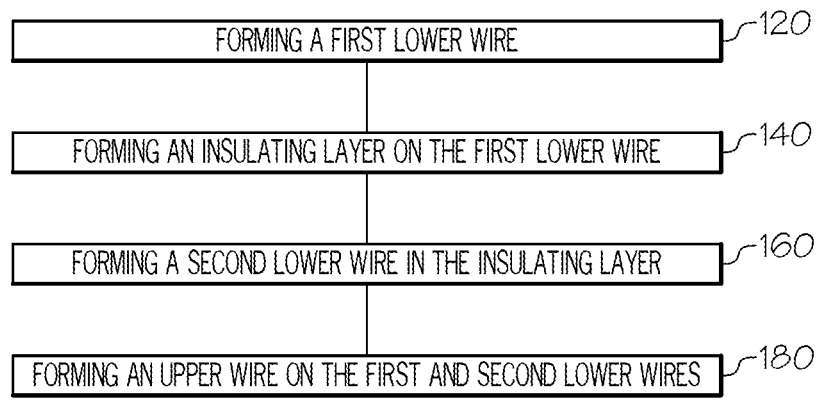
FIGS. 3 and 4 are flow charts of methods of forming an integrated circuit device according to some embodiments of the inventive concept.

FIG. 3 is a flow chart of a method of forming an integrated circuit device according to some embodiments of the inventive concept. FIGS. 5 through 8 are cross-sectional views illustrating a method of forming an integrated circuit device according to some embodiments of the inventive concept.

Figure 5:
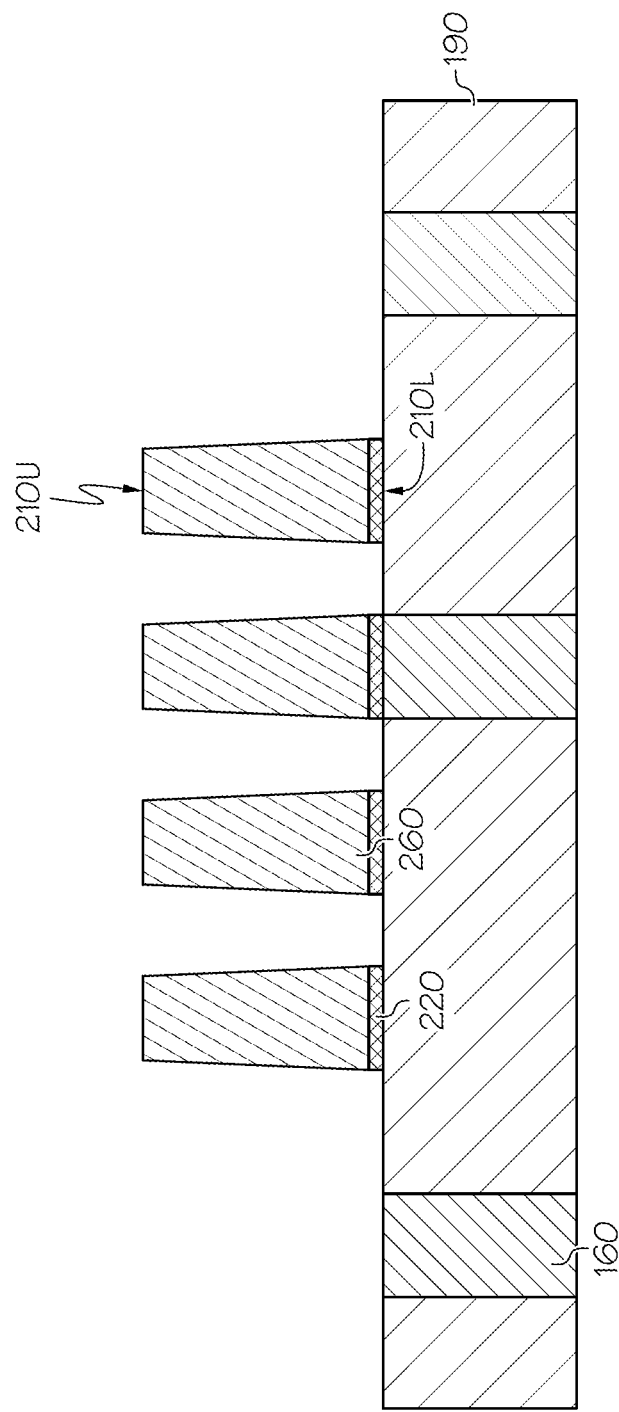
FIGS. 5 through 8 are cross-sectional views illustrating a method of forming an integrated circuit device according to some embodiments of the inventive concept.

Referring to FIGS. 3 and 5, the method may include forming first metal wires 210 (Block 120) on a first insulating layer 190 that may include lower contacts 160. The first metal wires 210 may be formed by depositing a first adhesion layer 220 and a first metal layer 260 and then patterning the first adhesion layer 220 and the first metal layer 260. Each of the first adhesion layer 220 and the first metal layer 260 may be formed by, for example, a physical vapor deposition (PVD) process, an atomic layer deposition (ALD) process, a chemical vapor deposition (CVD) process, and/or a plating process (e.g., an electroplating process). The first adhesion layer 220 and the first metal layer 260 may be patterned by an etch process (e.g., a dry etch process or a wet etch process).

The first metal wire 210 may include a lower surface 210L facing and/or contacting the first insulating layer 190 and an upper surface 210U opposite the lower surface 210L. The lower surface 210L of the first metal wire 210 may contact the lower contact 160 and may be electrically connected to the lower contact 160.

Figure 6:
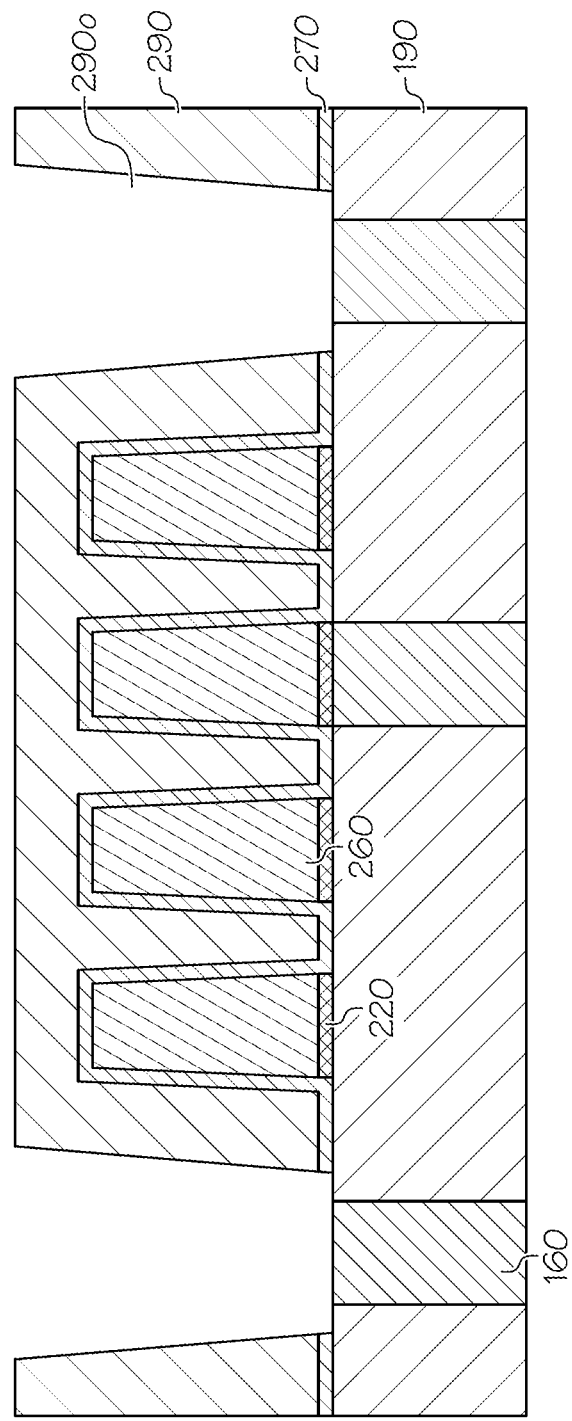

Referring to FIGS. 3 and 6, a second insulating layer 290 may be formed on the first metal wires 210 and the first insulating layer 190 (Block 140). In some embodiments, a lower etch stop layer 270 may be formed before forming the second insulating layer 290. The lower etch stop layer 270 may be conformally formed on underlying elements (e.g., the first metal wire 210 and the first insulating layer 190) and may have a uniform thickness as illustrated in FIG. 6. The second insulating layer 290 may include, for example, a flowable low dielectric material (e.g., SiCOH), and may be formed by a coating process (e.g., a spin coating process).

Openings 290o may be formed in the second insulating layer 290 and the lower etch stop layer 270. Each of the openings 290o may extend through the second insulating layer 290 and the lower etch stop layer 270. The openings 290o may expose upper surfaces of the lower contacts 160. The second insulating layer 290 may be formed to overlap the upper surfaces 210U of the first metal wires 210.

Figure 7:
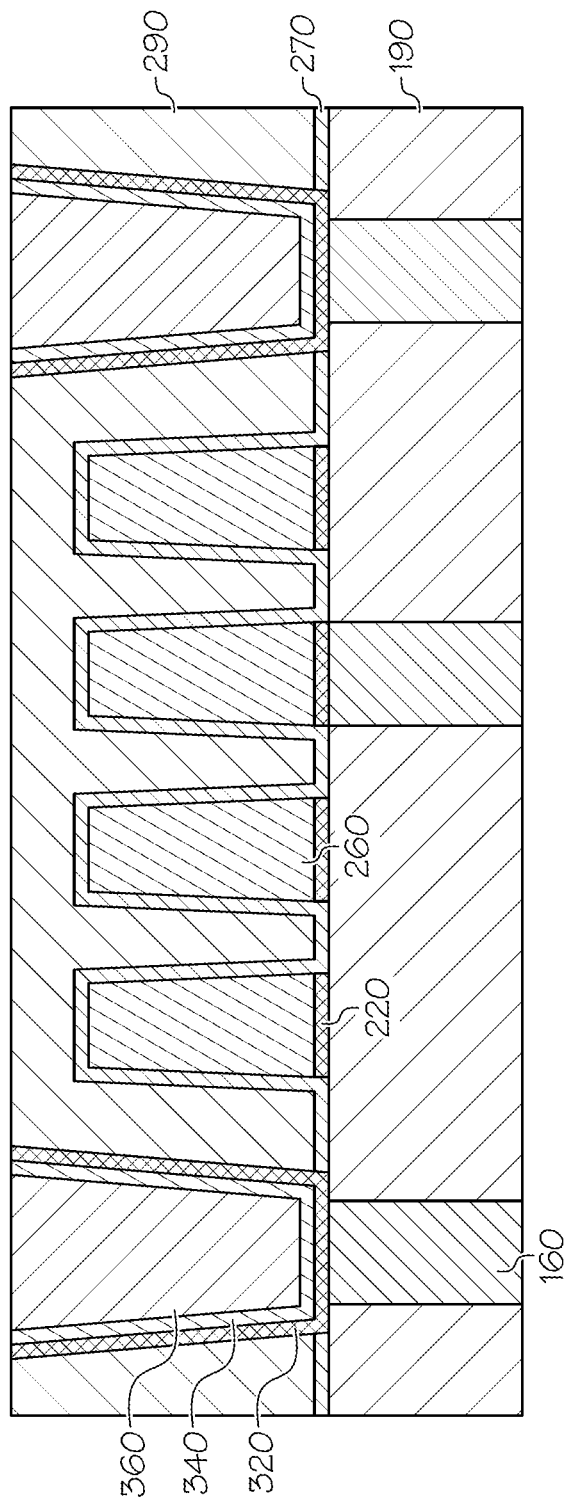

Referring to FIGS. 3 and 7, second metal wires 310 may be formed in the second insulating layer 290 (Block 160), specifically, in the openings 290o, respectively. The second metal wires 310 may be formed by, for example, a damascene process.

In some embodiments, a second adhesion layer 320 and a first thin metal layer 340 may be sequentially formed on the second insulating layer 290. Each of the second adhesion layer 320 and the first thin metal layer 340 may be formed conformally on underlying elements and may have a uniform thickness in the openings 290o as illustrated in FIG. 7. After that, a second metal layer 360 may be formed on the first thin metal layer 340. Each of the second adhesion layer 320, the first thin metal layer 340, and the second metal layer 360 may be formed by, for example, a PVD process, an ALD process, a CVD process, and/or a plating process. After the second metal layer 360 is formed, a planarization process (e.g., a chemical-mechanical polishing (CMP) process or an etch process) may be performed until an upper surface of the second insulating layer 290 is exposed.

Figure 8:
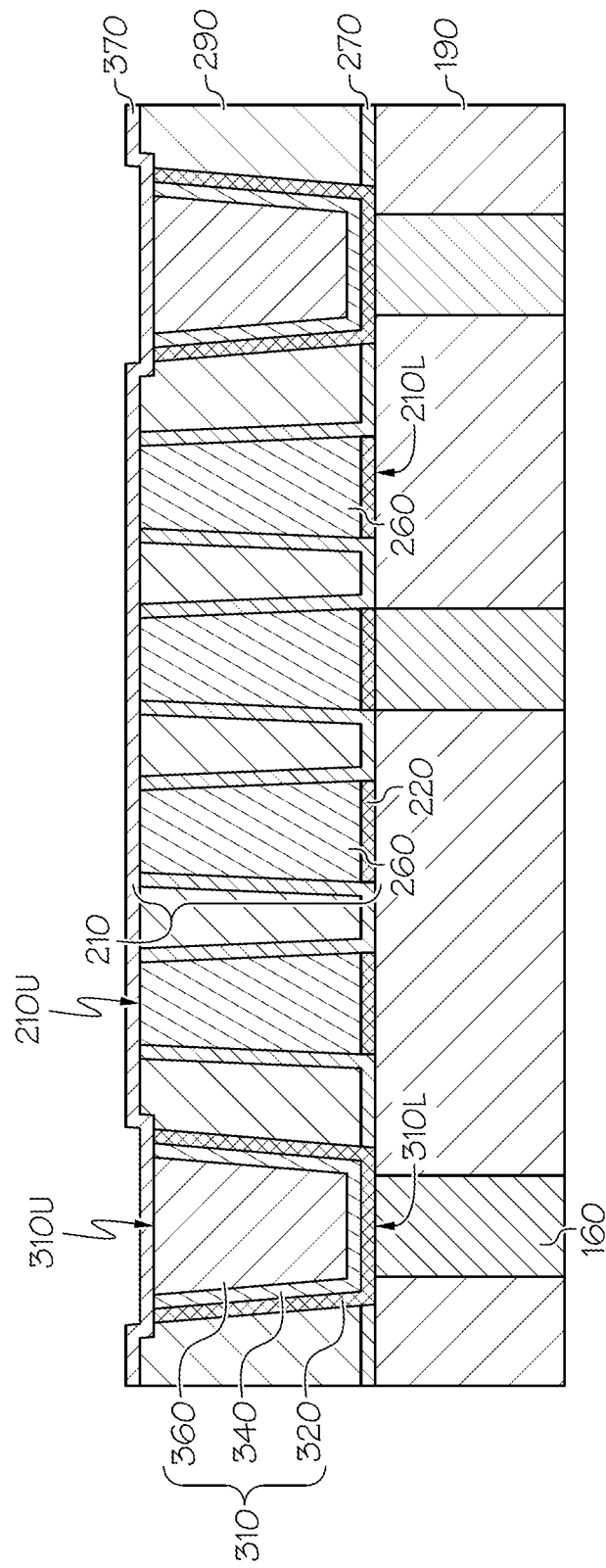

Referring to FIG. 8, a first etch process may be performed to remove a portion of the second insulating layer 290 and a portion of the lower etch stop layer 270. The first etch process may be performed until the upper surfaces 210U of the first metal wires 210 are exposed. A second etch process may be performed to remove a portion of the second metal wire 310. The second etch process may be performed until the upper surfaces 310U of the second metal wires 310 are recessed toward the first insulating layer 190 relative to the upper surfaces 210U of the first metal wires 210. The first etch process and the second etch process may be sequentially performed or concurrently performed.

After performing the first etch process and the second etch process, an upper etch stop layer 370 may be formed on the first metal wires 210, the second metal wires 310, and the second insulating layer 290. The upper etch stop layer 370 may be formed conformally on underlying elements and may have a uniform thickness as illustrated in FIG. 8.

Referring to FIGS. 1A and 3, a third insulating layer 390 and an upper wire 460 may be formed on the first metal wires 210 and the second metal wires 310 (Block 180). The upper wire 460 may be formed by, for example, a damascene process or an etch process.

Figure 4:
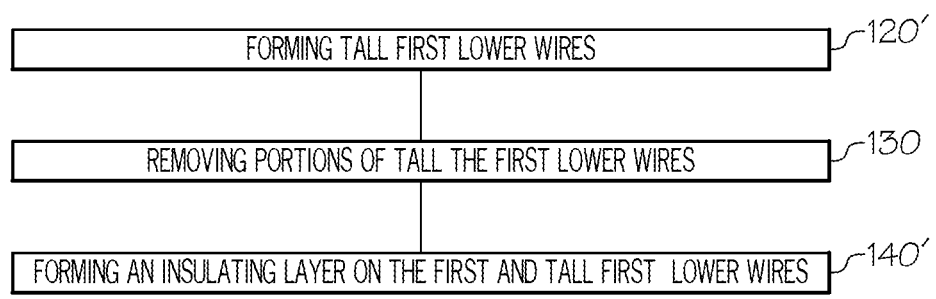

FIG. 4 is a flow chart of a method of forming an integrated circuit device according to some embodiments of the inventive concept. FIGS. 9 through 13 are cross-sectional views illustrating a method of forming an integrated circuit device according to some embodiments of the inventive concept.

Figure 9:
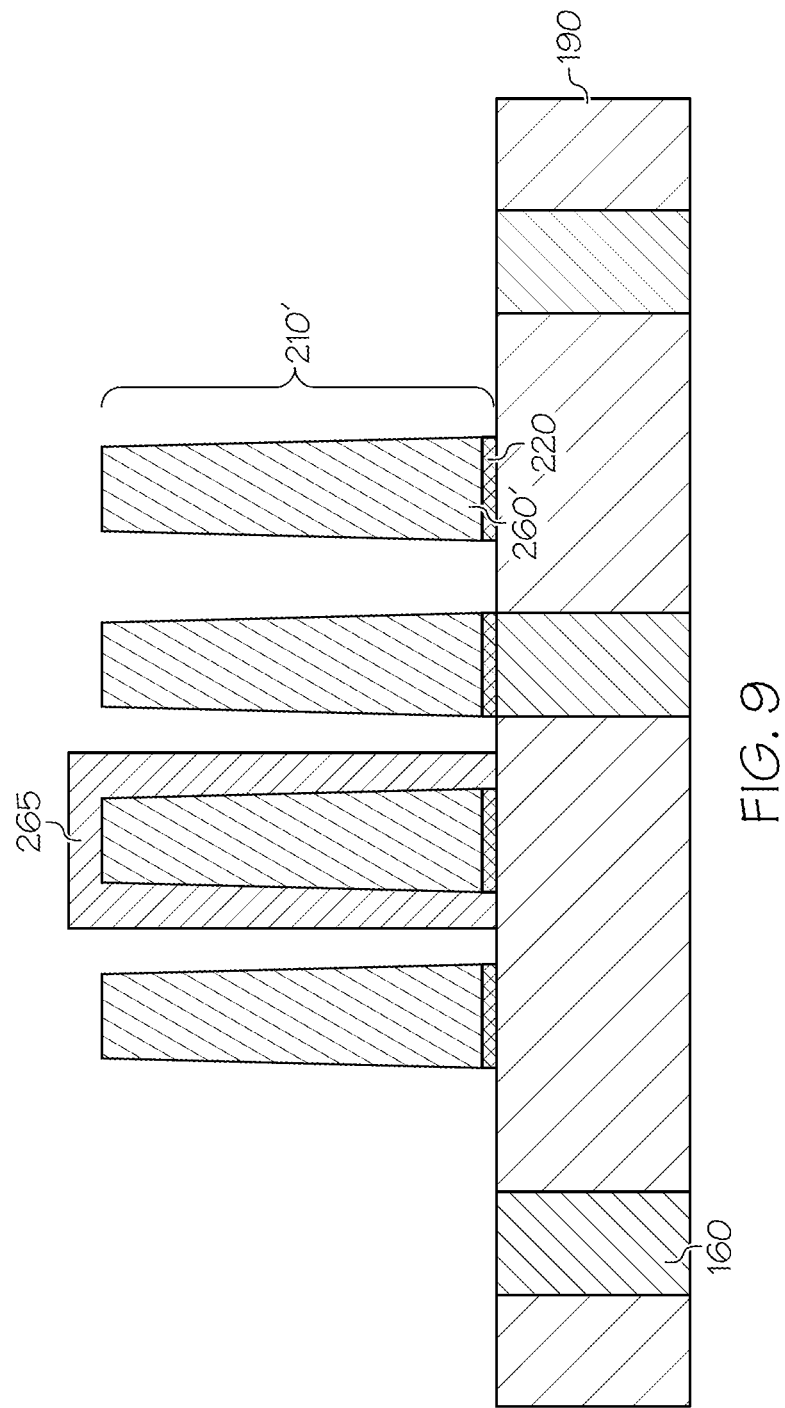
FIGS. 9 through 13 are cross-sectional views illustrating a method of forming an integrated circuit device according to some embodiments of the inventive concept.

Referring to FIGS. 4 and 9, the method may include forming tall first metal wires 210' on a first insulating layer 190 (Block 120') and then forming a mask layer 265 covering at least one of the tall first metal wires 210'. The tall first metal wires 210' may be formed by processes similar to the processes of forming the first metal wires 210 discussed with reference to FIG. 5. The mask layer 265 may include a material different from the first metal layer 260 and the first adhesion layer 220 to have an etch selectivity with respect to the first metal layer 260 and the first adhesion layer 220. The mask layer 265 may include, for example, TiN or metal oxide.

Figure 10:
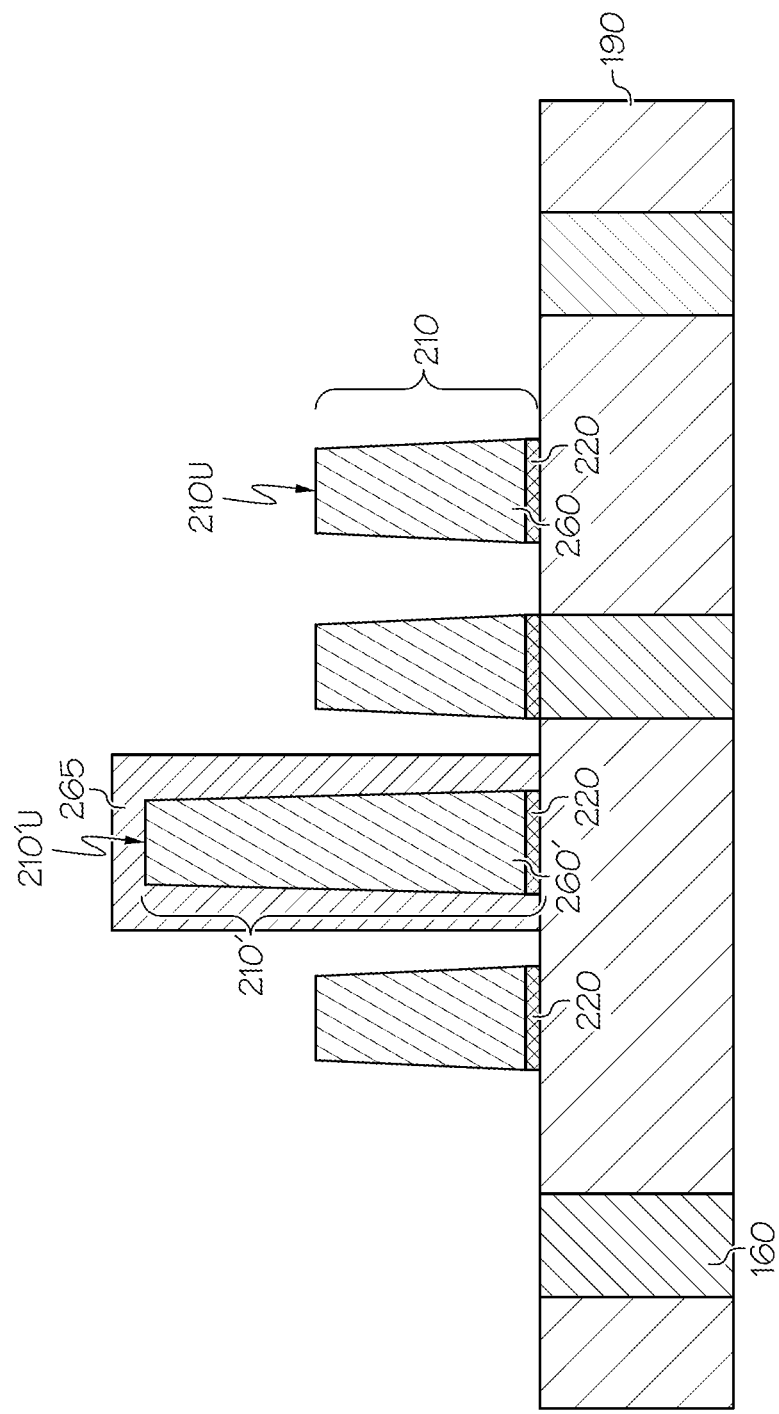

Referring to FIGS. 4 and 10, upper portions of tall first metal wires 210' that are not covered by the mask layer 265 may be removed (Block 130), thereby forming first metal wires 210. The upper portions of the tall first metal wires 210' may be removed by a dry etch process and/or a wet etch process.

Figure 11:
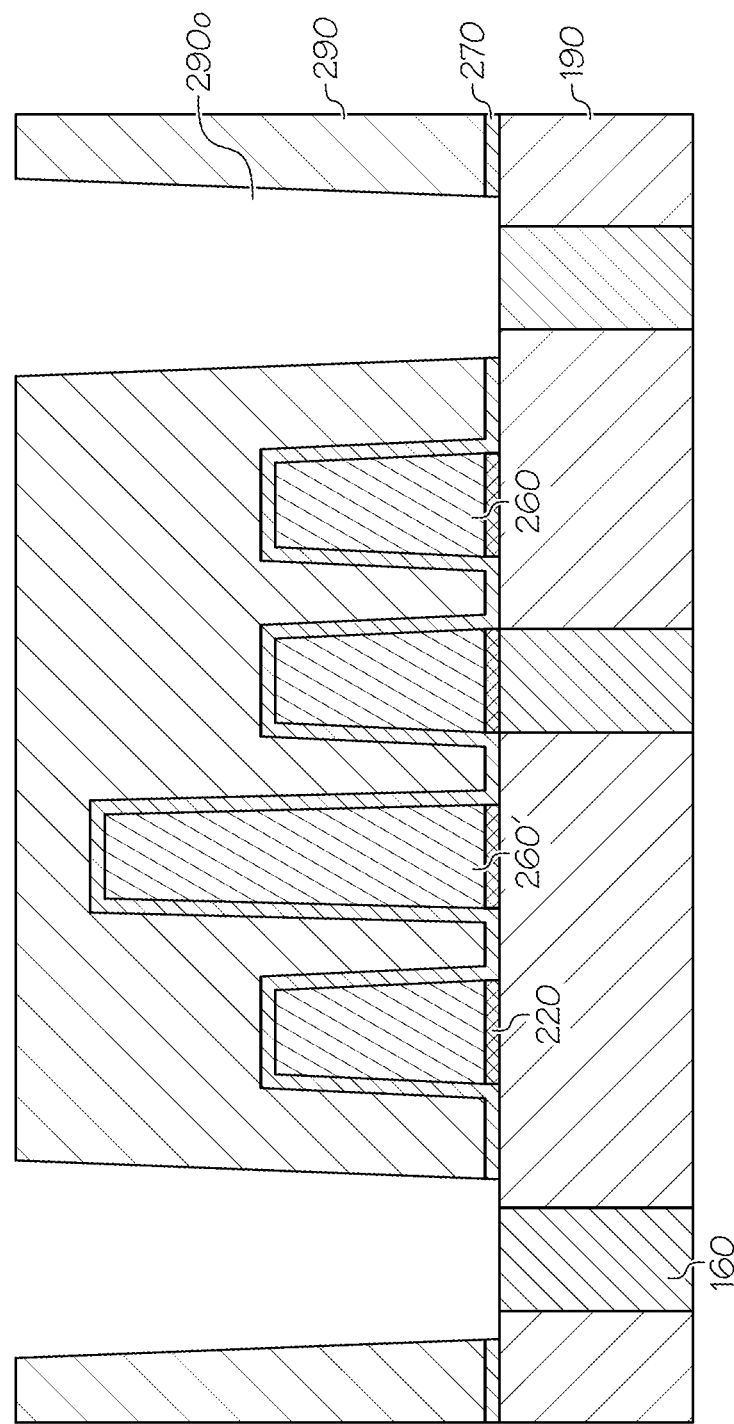

Referring to FIGS. 4 and 11, the mask layer 265 may be removed, and then a lower etch stop layer 270 and a second insulating layer 290 may be sequentially formed (Block 140') on the first metal wires 210 and the tall first metal wire 210'. Openings 290o may be formed in the second insulating layer 290 and the lower etch stop layer 270. Each of the openings 290o may extend through the second insulating layer 290 and the lower etch stop layer 270.

Figure 12:
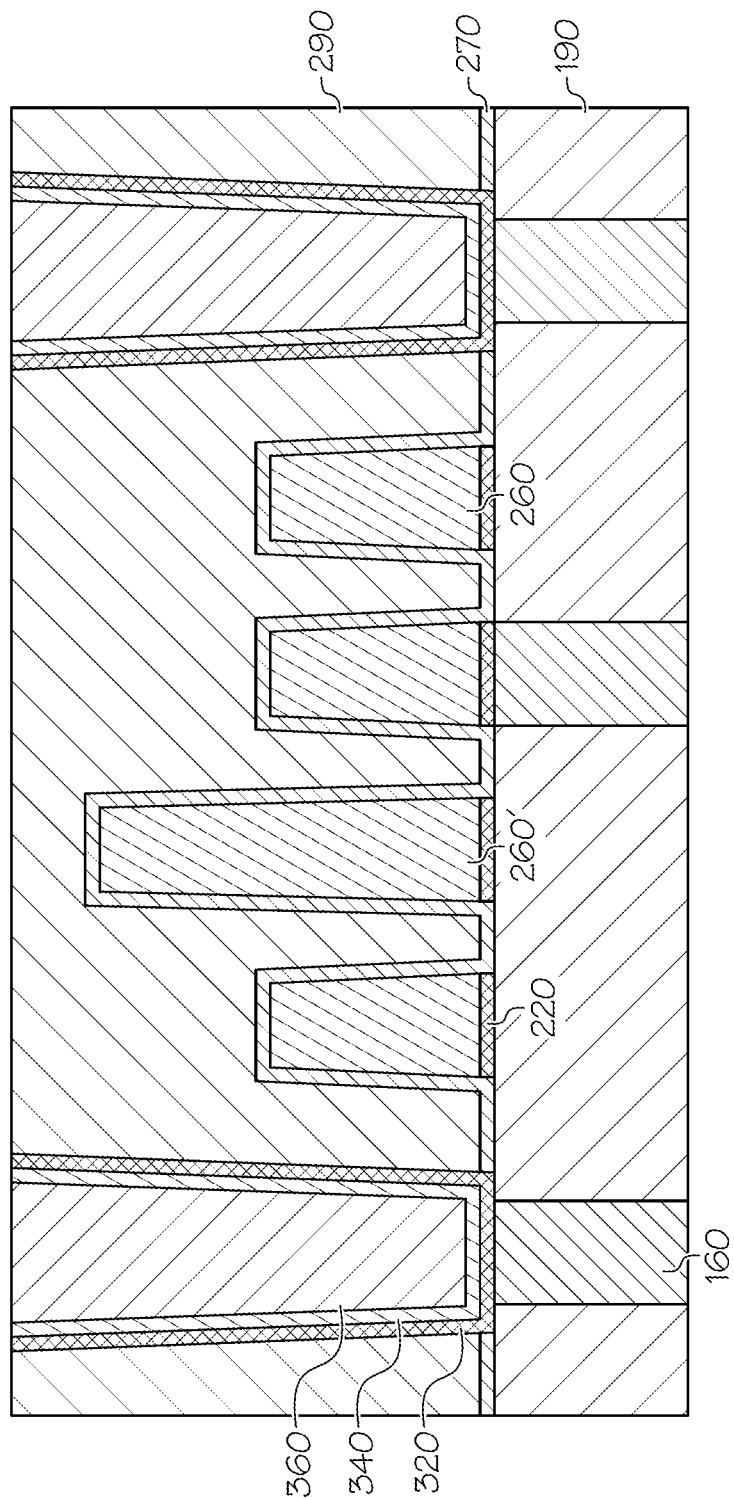

Referring to FIGS. 3 and 12, second metal wires 310 may be formed in the openings 290o, respectively, by processes similar to the processes of forming the second metal wires 310 discussed with reference to FIG. 7.

Figure 13:
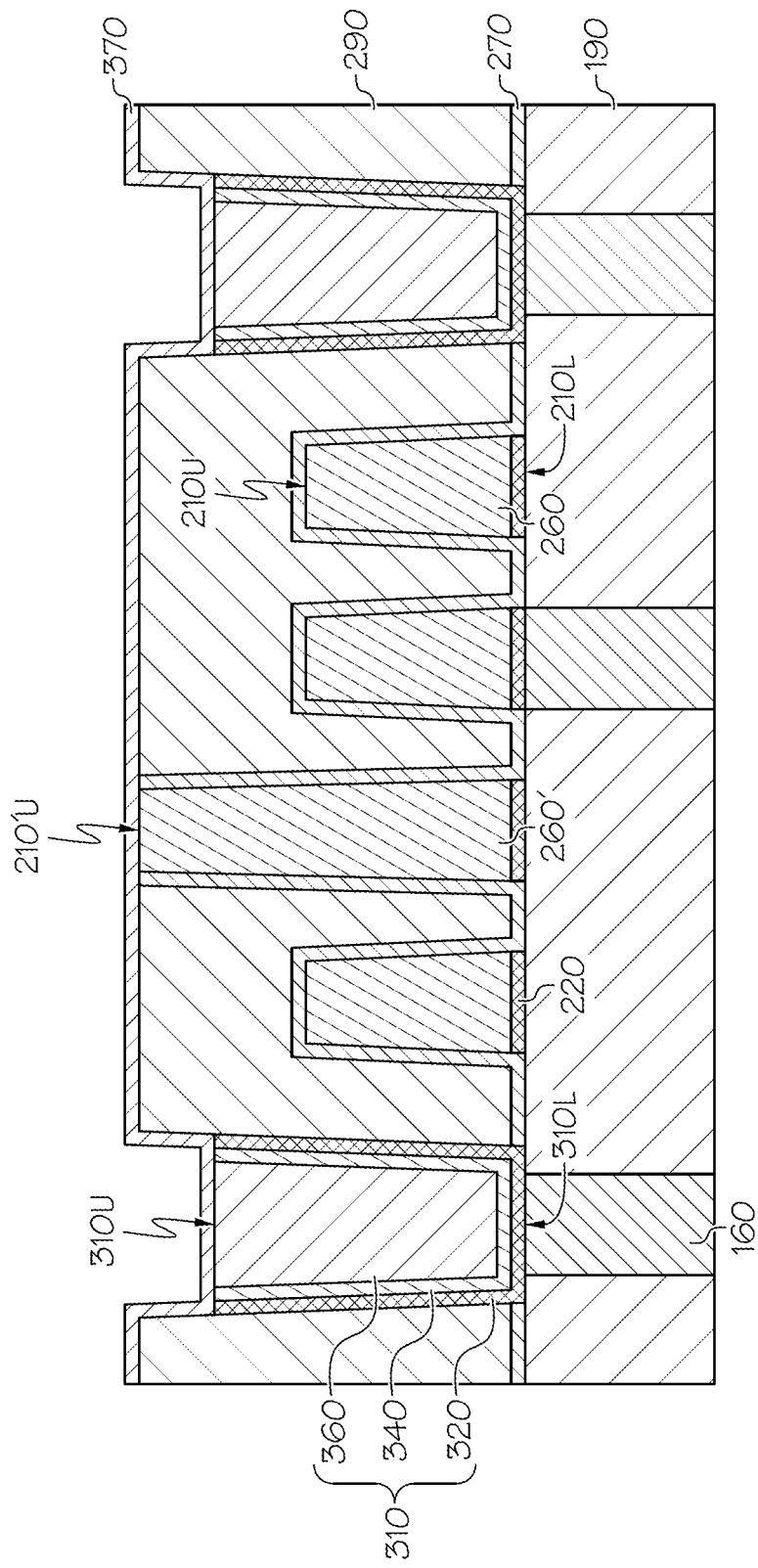

Referring to FIG. 13, processes similar to the processes discussed with reference to FIG. 8 may be performed. A first etch process may be performed to remove a portion of the second insulating layer 290 and a portion of the lower etch stop layer 270. The first etch process may be performed until the upper surface 210'U of the tall first metal wire 210' is exposed. A second etch process may be performed to remove a portion of the second metal wire 310. The second etch process may be performed until the upper surfaces 310U of the second metal wires 310 become closer to the first insulating layer 190 than the upper surface 210'U of the tall first metal wire 210'. The first etch process and the second etch process may be sequentially performed or concurrently performed.

After performing the first etch process and the second etch process, an upper etch stop layer 370 may be formed on the first metal wires 210, the second metal wires 310, and second insulating layer 290. The upper etch stop layer 370 may be formed conformally on underlying elements and may have a uniform thickness as illustrated in FIG. 13.

Referring to FIGS. 2A and 3, an upper wire 460 may be formed on the first metal wires 210 and the second metal wires 310 (Block 180). The upper wire 460 may be formed by, for example, a damascene process or an etch process.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein the term "and/or" includes any and all combinations of one or more of the associated listed items.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
    forming a first metal wire on a first insulating layer, the first metal wire comprising a first lower surface that faces the first insulating layer;
    after the first metal wire is formed, forming a lower etch stop layer on the first metal wire and the first insulating layer;
    forming a second insulating layer on the lower etch stop layer, wherein the first metal wire is provided in the second insulating layer;
    forming an opening extending through the second insulating layer and the lower etch stop layer;
    forming a second metal wire in the opening, the second metal wire comprising a second lower surface that faces the first insulating layer and is coplanar with the first lower surface;
    removing a portion of the second insulating layer and a portion of the lower etch stop layer to expose an upper surface of the first metal wire;
    forming an upper etch stop layer on the first metal wire, the second metal wire, and the second insulating layer;
    forming a third insulating layer on the first metal wire, the second metal wire, and the upper etch stop layer; and
    forming an upper wire on the first metal wire, the second metal wire, and the third insulating layer.

2. The method of claim 1, wherein forming the first metal wire comprises:
    forming a first metal layer on the first insulating layer; and
    etching the first metal layer to form the first metal wire.

3. The method of claim 1, wherein forming the second metal wire comprises:
    forming a second metal layer on an upper surface of the second insulating layer and in the opening; and
    removing the second metal layer until the upper surface of the second insulating layer is exposed.

4. The method of claim 3, wherein forming the second metal wire further comprises forming a thin metal layer in the opening before forming the second metal layer, and
    wherein the thin metal layer comprises a first metal element, and the second metal layer comprises a second metal element that is different from the first metal element.

5. The method of claim 4, wherein the first metal wire is devoid of the second metal element.

6. The method of claim 4, wherein the first metal wire comprises the first metal element.

7. The method of claim 4, wherein the first metal element is ruthenium (Ru), molybdenum (Mo), cobalt (Co), or tungsten (W).

8. The method of claim 4, wherein the second metal element is copper (Cu).

9. The method of claim 4,
    wherein forming the second metal wire further comprises forming an adhesion layer in the opening before forming the thin metal layer, and wherein the adhesion layer comprises a third metal element that is different from the first metal element and different from the second metal element.

10. The method of claim 3, wherein removing the second metal layer comprises a chemical-mechanical polishing process.

11. The method of claim 1, wherein the lower etch stop layer has a uniform thickness along a surface of the first metal wire and a surface of the first insulating layer.

12. The method of claim 1, wherein the lower etch stop layer and the second insulating layer comprise different materials.

13. The method of claim 1, wherein the lower etch stop layer comprises silicon carbon nitride (SiCN), aluminum oxide (AlO), and/or aluminum nitride (AlN).

14. The method of claim 1, wherein the first metal wire further comprises a first upper surface opposite the first lower surface and a sidewall connecting the first lower surface to the first upper surface, and
the lower etch stop layer separates the sidewall of the first metal wire from the second insulating layer.

15. The method of claim 14, wherein the lower etch stop layer contacts the sidewall of the first metal wire.

16. The method of claim 1, wherein the second insulating layer is formed after the first metal wire is formed.

17. The method of claim 1, wherein forming the opening comprises exposing a portion of the first insulating layer.

18. A method of forming an integrated circuit device, the method comprising:
forming a first metal wire on a first insulating layer;
after the first metal wire is formed, forming a lower etch stop layer on the first metal wire and the first insulating layer;
forming a second insulating layer on the lower etch stop layer, wherein the first metal wire is in the second insulating layer;
forming an opening extending through the second insulating layer and the lower etch stop layer to expose a portion of an uppermost surface of the first insulating layer; and
forming a second metal wire in the opening, on the exposed portion of the uppermost surface of the first insulating layer;
wherein a lower surface of the second metal wire is coplanar with a lower surface of the first metal wire; and
wherein said forming a second metal wire in the opening comprises recessing an upper surface of the second metal wire toward the first insulating layer relative to an upper surface of the first metal wire.

19. The method of claim 18,
wherein the opening exposes an upper surface of a contact that is in the first insulating layer, and
wherein the lower surface of the second metal wire is in contact with the upper surface of the contact and the portion of the uppermost surface of the first insulating layer.

20. The method of claim 18, wherein said recessing comprises exposing the upper surface of the first metal wire; and wherein said recessing is followed by conformally depositing an upper etch stop layer directly onto the exposed upper surface of the first metal wire.

21. The method of claim 20, wherein said conformally depositing comprises conformally depositing the upper etch stop layer directly onto an exposed upper surface of the second metal wire, which is recessed relative to the exposed upper surface of the first metal wire.

22. A method of forming an integrated circuit device, the method comprising:
forming a first metal wire on a first insulating layer;
after the first metal wire is formed, forming a lower etch stop layer on the first metal wire and the first insulating layer;
forming a second insulating layer on the lower etch stop layer, wherein the first metal wire is in the second insulating layer;
forming an opening extending through the second insulating layer and the lower etch stop layer;
forming a second metal wire in the opening, wherein a lower surface of the second metal wire is coplanar with a lower surface of the first metal wire;
removing a portion of the second insulating layer and a portion of the lower etch stop layer to expose an upper surface of the first metal wire; and
forming an upper etch stop layer on the exposed upper surface of the first metal wire, and on the second metal wire and the second insulating layer.

* * * * *